United States Patent
Shimoyama et al.

(10) Patent No.: US 7,394,341 B2
(45) Date of Patent: Jul. 1, 2008

(54) COIL ELECTRIC CONDUCTOR, LAMINATED COIL CONDUCTOR, PRODUCTION METHOD OF THE SAME AND ELECTRONIC COMPONENT USING THE SAME

(75) Inventors: Koji Shimoyama, Itami (JP); Nobuya Matsutani, Katano (JP); Yuji Mido, Higashiosaka (JP); Michio Ohba, Tondabayashi (JP); Akihiko Ibata, Takaishi (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 161 days.

(21) Appl. No.: 11/017,884

(22) Filed: Dec. 22, 2004

(65) Prior Publication Data

US 2005/0140488 A1    Jun. 30, 2005

(30) Foreign Application Priority Data

Dec. 26, 2003    (JP) .............................. 2003-433144

(51) Int. Cl.
 *H01F 5/00*    (2006.01)
(52) U.S. Cl. ..................................... 336/200
(58) Field of Classification Search ............... 336/200
 See application file for complete search history.

(56) References Cited

U.S. PATENT DOCUMENTS

| | | | |
|---|---|---|---|
| 3,042,591 A | 7/1962 | Cado | |
| 5,187,119 A | 2/1993 | Cech et al. | |
| 5,398,400 A | 3/1995 | Breen | |
| 5,666,722 A | 9/1997 | Tamm et al. | |
| 5,738,931 A * | 4/1998 | Sato et al. | 428/209 |
| 6,469,609 B2 * | 10/2002 | Lee et al. | 336/200 |
| 6,600,404 B1 * | 7/2003 | Kajino | 336/200 |
| 6,830,970 B2 * | 12/2004 | Gardes | 438/238 |
| 6,940,385 B2 * | 9/2005 | Kusano | 336/200 |
| 2002/0030576 A1 * | 3/2002 | Kusano | 336/223 |
| 2003/0135981 A1 | 7/2003 | Galyean | |

FOREIGN PATENT DOCUMENTS

| | | |
|---|---|---|
| EP | 0 203 204 | 12/1986 |
| JP | 63-113812 | 5/1988 |
| JP | 11-69684 | 3/1999 |
| JP | 11-204337 | 7/1999 |
| JP | 11-204361 | 7/1999 |
| JP | 2001-267166 | 9/2001 |
| WO | 02/054840 | 7/2002 |

OTHER PUBLICATIONS

European Search Report issued Oct. 19, 2007 in a European application that is a foreign counterpart to the present application.

* cited by examiner

*Primary Examiner*—Elvin Enad
*Assistant Examiner*—Joselito Baisa
(74) *Attorney, Agent, or Firm*—Wenderoth, Lind & Ponack, L.L.P.

(57) ABSTRACT

A coil electric conductor has an insulating substrate, a first conductive layer, and a second conductive layer. The first conductive layer is formed at a depression provided on a face of the insulating substrate. The second conductive layer is formed on the first conductive layer with the first conductive layer interposed between the second conductive layer and the insulating substrate. This construction realizes a coil electric conductor having a highly precisely uniformized cross-sectional shape.

17 Claims, 11 Drawing Sheets

COIL ELECTRIC CONDUCTOR, LAMINATED COIL CONDUCTOR, PRODUCTION METHOD OF THE SAME AND ELECTRONIC COMPONENT USING THE SAME

BACKGROUND OF THE INVENTION

1. Field of the Invention

The present invention relates to a coil electric conductor and a laminated coil electric conductor which are used in various kinds of electronic components such as transformers and choke coils. The invention further relates to a production method for these conductors as well as an electronic component using these conductors.

2. Background Art

Related-art production methods for coil electric conductors are described in Japanese Patent Unexamined Publication No. 2001-267166 (hereinafter referred to as Patent Document 1) and H11-204361 (hereinafter referred to as Patent Document 2).

FIG. 16A to FIG. 16E are cross-sectional views showing a production method for a coil electric conductor, which is described in Patent Document 1.

First, in a background conductive layer forming process (FIG. 16A), background conductive layer (hereinafter referred to as the background layer) 51 is formed on insulating substrate 50. In a resist pattern forming process (FIG. 16B), resist pattern 52 is formed so that a face of background layer 51 is spirally exposed. In a first electroplating process (FIG. 16C), electroplating using background layer 51 as a background is performed and central conductor (hereinafter referred to as conductor) 53 having a substantially rectangular cross section is formed. In a resist pattern peeling process (FIG. 16D), resist pattern 52 is peeled. In a second electroplating process (FIG. 16E), electroplating using conductor 53 as a background is performed and conductive face layer (hereinafter referred to as conductive layer) 54 is formed. In this manner, coil electric conductor 55 made of conductor 53 and conductor layer 54 which coats conductor 53 is produced.

However, coil electric conductor 55 is formed so that conductor layer 54 coats conductor 53, by means of the electroplating using conductor 53 as a background, and since the circulation in a plating bath for electroplating varies according to individual patterns of coil electric conductor 55, variations occur in the concentration distribution in the plating bath. Furthermore, plating layers become thin at positions remote from a power supply section (not shown). For this reason, the cross-sectional shape of coil electric conductor 55 is difficult to produce with high precision.

The cross-sectional shape of coil electric conductor 55 should be originally uniform in any section thereof. However, variations in precision cause nonuniformity of the cross-sectional shape. As a result, the conductivity of coil electric conductor 55 lowers. Precision is improved by reducing the current during electroplating, but this increases the operating time and lowers productivity.

Furthermore, since background layer 51 is peeled by etching after the resist pattern peeling process (FIG. 16D), the production process becomes complicated. In addition, if background layer 51 is not completely peeled, adjacent turns of coil electric conductor 55 are easily connected and electrically short-circuited.

Furthermore, the turns of coil electric conductor 55 are juxtaposed at narrow intervals, so that some of the turns of coil electric conductor 55 are easily brought into contact with one another and electrically short-circuited, by external impact during mounting of coil electric conductor 55.

In addition, if an electronic component using coil electric conductor 55 is used for a long time, a metal constituent used in coil electric conductor 55 moves through the faces of an insulator. As a result, mutually adjacent turns of coil electric conductor 55 or coil electric conductor 55 and other electronic components can cause short-circuits or insulating failures; that is to say, a migration phenomenon occurs. In addition, it is generally recommended that the same kind of material be used as the constituent material of each of conductor 53 and conductor layer 54, and a material of high conductivity is used for conductor 53 and conductor layer 54 in order to improve the conductivity of coil electric conductor 55. However, in general, metals of high conductivity tend to easily cause a migration phenomenon. Accordingly, if a material which does not easily cause a migration phenomenon is used for conductor 53 and conductor layer 54, the conductivity of coil electric conductor 55 becomes low.

FIGS. 17A to 17G are cross-sectional views showing a production method for a coil electric conductor, which is described in Patent Document 2.

First, background thin film layer (hereinafter referred to as background layer) 57 is formed on insulating substrate 56 (FIG. 17A). Then, positive photo resist layer (hereinafter referred to as resist layer) 58 is laminated on background layer 57 (FIG. 17B). Then, positive photo resist mask pattern (hereinafter referred to as the mask) 59 is formed from resist layer by a photolithography method (FIG. 17C). Then, coil electric conductor plating layer (hereinafter referred to as plating layer) 61 having a mushroom-shaped cross section is formed by electroplating. Plating layer 61 grows and is formed on both exposed section 60 of background layer 57 and mask 59 close to exposed section 60 (FIG. 17D). Then, protecting metal thin film layer (hereinafter referred to as protective layer) 62 which coats the whole of plating layer 61 is formed by electroplating (FIG. 17E). Then, the whole face of protective layer 62 is irradiated with activating radiation, whereby mask 59 exposed through gap 63 in plating layer 61 is developed and removed (FIG. 17F). Furthermore, background layer 57 is removed by etching (FIG. 17G). In this manner, coil electric conductor 64 made of background layer 57, plating layer 61 and protective layer 62 is produced.

Background layer 57 on insulating substrate 56 is electroplated, whereby plating layer 61 grows and coil electric conductor 64 is formed. Furthermore, protective layer 62 formed by electroplating coats a face of plating layer 61. As described above, in the case of electroplating, coil electric conductor 64 having a mushroom-shaped cross section is difficult to produce with high precision. In addition, the cross-sectional shape of coil electric conductor 64 becomes non-uniform.

In addition, after the coating of protective layer 62, mask 59 is peeled by exposure and development, and background layer 57 is peeled by etching, so that the production process becomes complicated. Furthermore, if background layer 57 is not completely peeled, electrical short-circuiting easily occurs.

Furthermore, the adjacent turns of coil electric conductor 64 are juxtaposed at narrow intervals, so that some of the adjacent turns of coil electric conductor 64 are easily brought into contact with one another and electrically short-circuited, by external impact during mounting of coil electric conductor 64.

SUMMARY OF THE INVENTION

A coil electric conductor according to the invention has an insulating substrate, a first conductive layer, and a second conductive layer. The first conductive layer is formed in a depression provided on a face of the insulating substrate. The second conductive layer is formed on the first conductive layer with the first conductive layer interposed between the second conductive layer and the insulating substrate. This construction realizes a coil electric conductor having a highly precisely uniformized cross-sectional shape.

DETAILED DESCRIPTION OF THE INVENTION

Embodiment 1

Figure 1:
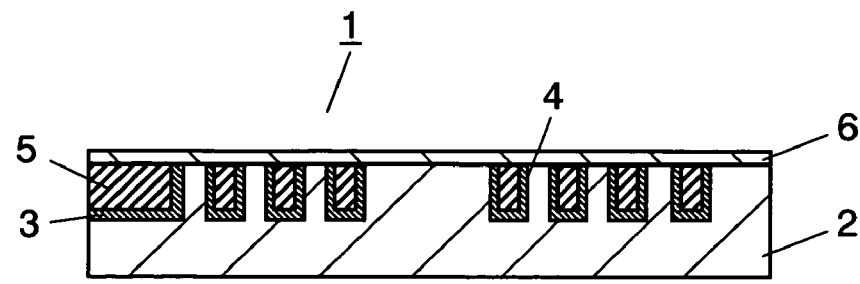
FIG. 1 is a cross-sectional view showing the construction of a coil electric conductor according to Embodiment 1 of the invention.

FIG. 1 is a cross-sectional view showing the construction of a coil electric conductor according to Embodiment 1 of the invention.

As shown in FIG. 1, coil electric conductor 1 has first insulating substrate (hereinafter referred to as substrate) 2, first conductive layer (hereinafter referred to as conductive layer) 3, second conductive layer (hereinafter referred to as conductive layer) 5, and protective layer 6.

The conductive layers 3 and 5 are formed at first depression (hereinafter referred to as depression) 4 provided at substrate 2. The shape of depression 4 determines the shapes of conductive layers 3 and 5. Accordingly, the shape of depression 4 controlled into desired shapes can ensure precision improvement and uniformity in conductive layers 3 and 5.

Since substrate 2 exists between each juxtaposed pair of conductive layers 3 and 5, adjacent pairs of conductive layers 3 and 5 are not prevented from coming into contact with each other. Furthermore, when coil electric conductor 1 is mounted on a substrate or the like as an electronic component such as an inductance device, even if external impact is applied, it is possible to restrain occurrence of a problem such as an electric short circuit.

In the case where conductive layer 3 is made of a metal including nickel (Ni) as a major constituent and conductive layer 5 is made of a metal including copper (Cu) as a major constituent, further advantages are obtained as will be described below.

The metal including Ni as a major constituent has a strong anchor effect, and increases the adhesion between conductive layer 3 and substrate 2. Accordingly, it is possible to prevent peeling of conductive layer 3 from substrate 2 due to vibrations of an electronic component or impact caused by a fall or the like.

The metal including Ni as a major constituent is superior in migration resistance compared to Cu. An electroless plating film of nickel-boron (Ni—B) alloy and an electroless plating film of nickel-phosphorus (Ni—P) alloy have particularly high migration resistance. Since conductive layer 5 is made of the metal including Cu as a major constituent, the electric conductivity of coil electric conductor 1 can be made high. Furthermore, since conductive layer 3 is made of the metal including Ni as a major constituent, migration resistance performance is improved. Accordingly, coil electric conductor 1 can compatibly realize electric conductivity and migration resistance performance.

Conductive layer 3 may be made of the metal including Ni as a major constituent, while conductive layer 5 may be made of a metal including Ag as a major constituent. In this case as well, it is possible to produce coil electric conductor 1 in which the adhesion between conductive layer 3 and substrate 2 is ensured and which has high electric conductivity and superior migration resistance.

Conductive layer 3 may be made of a metal including Cu as a major constituent, while conductive layer 5 may be made of a metal including Cu or Ag as a major constituent. In this case, it is possible to produce coil electric conductor 1 which has superior migration resistance performance and high electric conductivity.

In addition, conductive layer 3 may be made of a metal including Ag as a major constituent. In this case, high adhesion can be obtained between conductive layer 3 and substrate 2.

Figure 2:
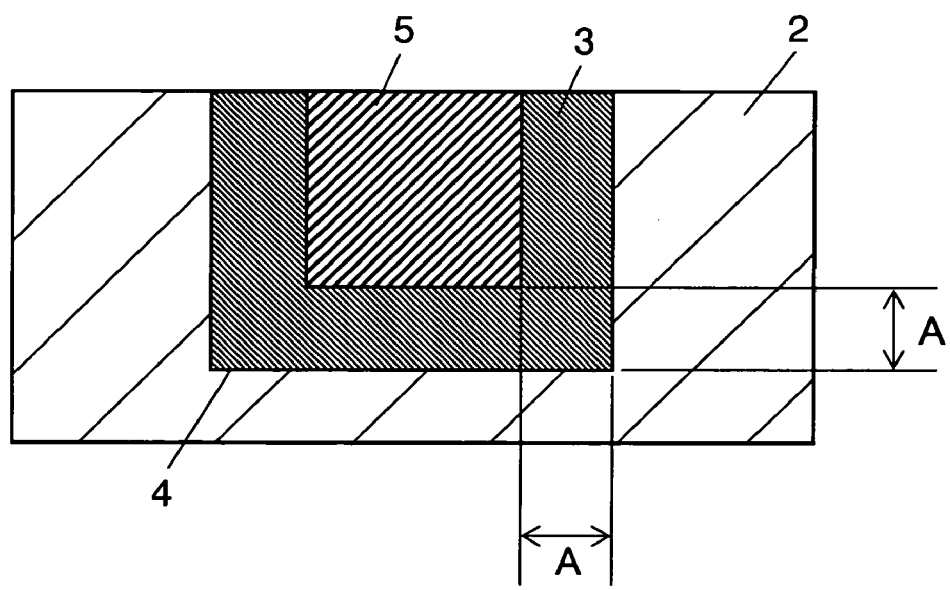
FIG. 2 is an enlarged cross-sectional view showing the construction of the coil electric conductor shown in FIG. 1.

In the case where conductive layer 3 is made of the metal including Ni as a major constituent, a thickness A of conductive layer 3 is preferably not greater than 10 μm as shown in FIG. 2. The metal including Ni as a major constituent has high performance in terms of anchor effect and migration resistance performance, but is low in electric conductivity compared to the metals including Cu and Ag as a major constituent, which are used for conductive layer 5. Furthermore, the electroless Ni—B plating film and the electroless Ni—P plating film have high electric resistance compared to Ni. Making conductive layer 3 as thin as possible causes coil electric conductor 1 to have high electric conductivity.

Substrate 2 is not limited to a particular material, and may use any kind of material having electric insulating properties, such as polyimide, glass epoxy or phenol resin.

Coil electric conductor 1 in which the conductive layers 3 and 5 are provided on only one of the faces of substrate 2 has been described above with reference to FIG. 1, but coil electric conductor 1 may have a structure in which conductive layers 3 and 5 are provided on the opposite face as well.

FIGS. 3A to 3I are cross-sectional views showing a production method for coil electric conductor 1. The production method for coil electric conductor 1 will be sequentially described below.

Figure 3A:
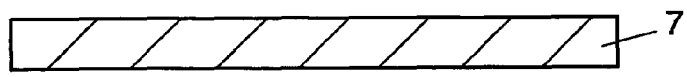
FIGS. 3A to 3I are cross-sectional views showing a production method for the coil electric conductor shown in FIG. 1.
Figure 3B:
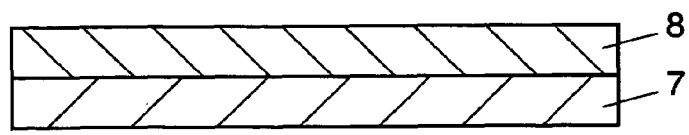
Figure 3C:
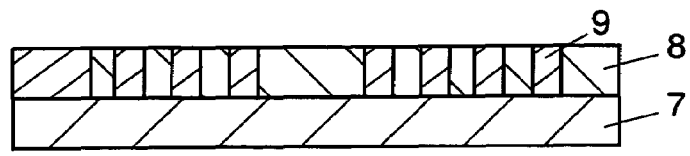
Figure 3D:
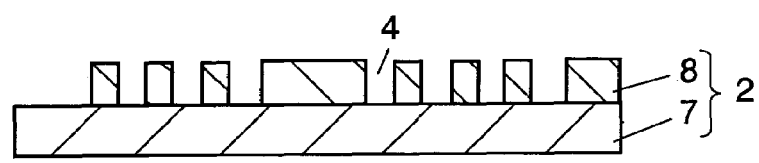

First, as shown in FIG. 3A, insulating substrate (hereinafter referred to as substrate) 7 including polyimide as a main material is prepared. Then, as shown in FIG. 3B, a photo resist material is uniformly coated or stuck onto a face of insulating substrate 7, thereby forming photo resist layer 8. Then, as shown in FIG. 3C, the photo resist layer 8 is exposed in a predetermined pattern to illumination from a mercury lamp (not shown) via a mask, whereby exposed section 9 of photo resist layer 8 is changed itself. Then, as shown in FIG. 3D, exposed section 9 is developed to form depression 4 on a face of substrate 7. Depression 4 determines the shapes of conductive layers 3 and 5. The above-described process is a first depression forming process.

Figure 3E:
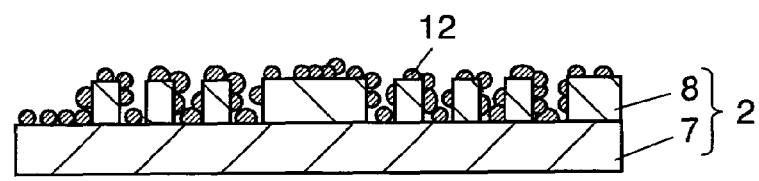
Figure 3F:
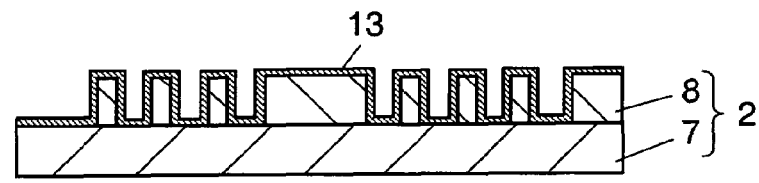

Substrate 2 shown in FIG. 1 is formed by remaining photo resist layer 8 and insulating substrate 7. Then, as shown in FIG. 3E, palladium (Pd) is coated onto face of substrate 2 as catalyst 12 for electroless plating. After that, as shown in FIG. 3F, first conductive layer (hereinafter referred to as conductive layer) 13 is provided on the face of substrate 2 including depression 4 by electroless plating. This process is a first first-conductive-layer forming process.

Figure 3G:
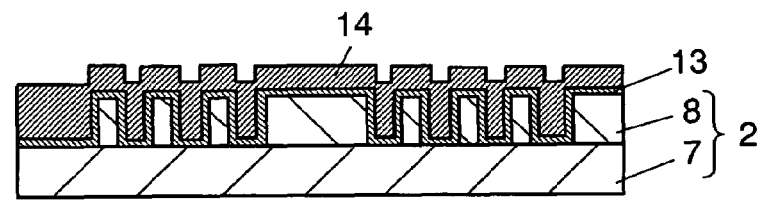

Then, as shown in FIG. 3G, second conductive layer (hereinafter referred to as conductive layer) 14 is provided on conductive layer 13 by electroplating using conductive layer 13 as a section to which electricity is to be supplied. Conductive layer 14 is formed with conductive layer 13 interposed between conductive layer 14 and substrate 2. This process is a first second-conductive-layer forming process.

Figure 3H:
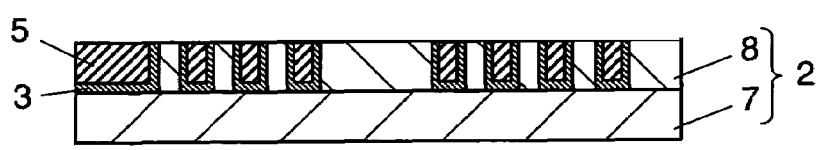
Figure 3I:
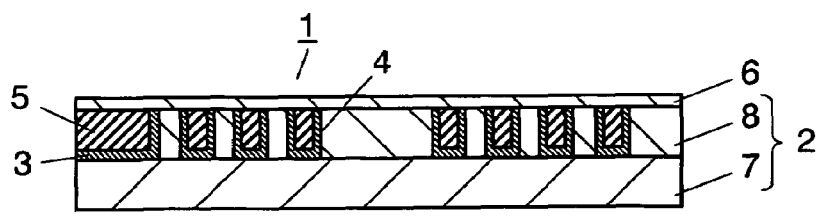

Then, as shown in FIG. 3H, in a first removing process, the conductive layers 13 and 14 are removed by being polished until the face of substrate 2 is exposed. Respective conductive layers 13 and 14 which are left after polishing constitute conductive layers 3 and 5 shown in FIG. 1. Finally, as shown in FIG. 3I, in a protective-layer forming process, protective layer 6 is stuck onto the face of substrate 2.

In the production method for coil electric conductor 1 shown in FIGS. 3A to 3I, the process of etching the section between each juxtaposed pair of conductive layers 3 and 5 is not necessary after the formation of coil electric conductor 1. Accordingly, as compared with the related art process, the production method includes a small number of production processes and is suitable for mass production.

Although exposure and development are performed when depression 4 is to be formed in the processes of FIGS. 3A to 3D, the kind and the shape of the mask and the kind of light to be illuminated are not particularly limitative. For example, a negative type of photo resist layer 8 may be used so that an unexposed section is removed, or exposure using ultraviolet rays except the mercury lamp or X-rays may also be used. Except for exposure and development, substrate 2 having depression 4 can be formed by pressing substrate 7 with a die. During pressing, heat or light energy can also be used.

In the processes of FIGS. 3E and 3F, electroless plating is used for the formation of conductive layer 13. During this time, palladium (Pd) is used as catalyst 12, but it is possible to use other kinds of catalysts usable for electroless plating, such as metal nano-particles of gold, silver, titanium and the like. Conductive layer 13 may also be formed directly on substrate 2 by using evaporation or sputtering instead of electroless plating.

Although conductive layers 13 and 14 are removed by polishing in the process of FIG. 3H, it is possible to use any other method, such as grinding, cutting or machining except polishing, which can remove part of conductive layers 13 and 14 until conductive layers 13 and 14 become flush with the face of substrate 2.

In the case where depression 4 is formed in a shape such as a circular spiral, a rectangular spiral or a polygonal line, coil electric conductor 1 functions as an electronic component such as an inductance device. However, depression 4 is not necessarily limited to any of the above-mentioned shapes.

Embodiment 2

Figure 4:
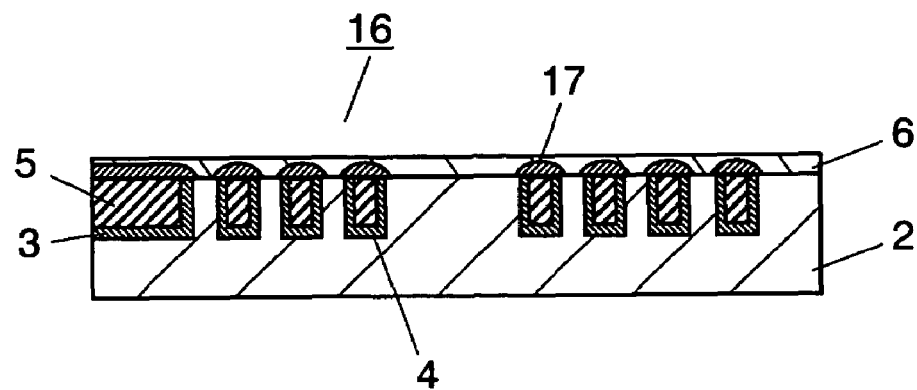
FIG. 4 is a cross-sectional view showing the construction of a coil electric conductor according to Embodiment 2 of the invention.

FIG. 4 is a cross-sectional view showing the construction of a coil electric conductor according to Embodiment 2. In FIG. 4, the same reference numerals are used to denote the same constituent elements as those of the construction of Embodiment 1 shown in FIG. 1, and detailed description is omitted herein.

Referring to FIG. 4, as compared with coil electric conductor 1, coil electric conductor 16 has third conductive layer (hereinafter referred to as conductive layer) 17 between conductive layers 3, 5 and protective layer 6.

Coil electric conductor 16 shown in FIG. 4 has the following advantages in addition to the advantages of coil electric conductor 1 mentioned above in the description of Embodiment 1.

Conductive layer 17 is disposed to coat the faces of conductive layers 3 and 5 which are to be brought into contact with protective layer 6. Accordingly, the space factor of coil electric conductor 16 is improved, and coil electric conductor 16 having higher electric conductivity can be produced. The space factor of coil electric conductor 16 means the volume occupied in coil electric conductor 16 by the conductor section thereof. Namely, the space factor is represented by the proportion occupied by the cross-sectional areas of conductive layers 3, 5 and 17 in the entire cross-sectional area of a rectangular area defined by a width corresponding to the array pitch of coil electric conductor 16 and a height corresponding to the thickness of coil electric conductor 16 within a cross section of coil electric conductor 16 which is taken perpendicularly to the extending direction thereof. Coil electric conductor 16 having a high space factor has a large capacity for signal transmission, and is suitable for uses which require a high density of signal transmission.

Accordingly, it is preferable to use a metal including Cu or Ag of comparatively high electric conductivity as a major constituent for conductive layer 17 in order to improve the electric conductivity of coil electric conductor 16. In the case where conductive layer 17 is made of a metal including Cu as a major constituent, coil electric conductor 16 which has superior migration resistance and high electric conductivity can be produced. In the case where conductive layer 17 is made of a metal including Ag as a major constituent, high adhesion can be ensured between conductive layer 17 and protective layer 6.

In addition, conductive layer 17 can obtain the following advantages by using a metal including Ni as a major constituent.

The metal including Ni as a major constituent has a strong anchor effect, and increases the adhesion between conductive layer 17 and protective layer 6. Accordingly, it is possible to prevent peeling of conductive layer 17 from protective layer 6 due to vibrations applied to coil electric conductor 16 or impact due to a fall or the like.

The metal including Ni as a major constituent is superior in migration resistance. An electroless Ni—B plating film and an electroless Ni—P plating film have particularly high migration resistance. Accordingly, it is possible to produce coil electric conductor 16 having superior migration resistance performance. Particularly in the case where conductive layer 3 is also made of a metal including Ni as a major constituent, conductive layer 5 is surrounded by the metal including Ni as a major constituent and can offer extremely high migration resistance performance.

Advantages obtainable when the composition of each of conductive layers 3 and 5 is specified are similar to those described in Embodiment 1, and the same description is omitted herein.

Figure 5:
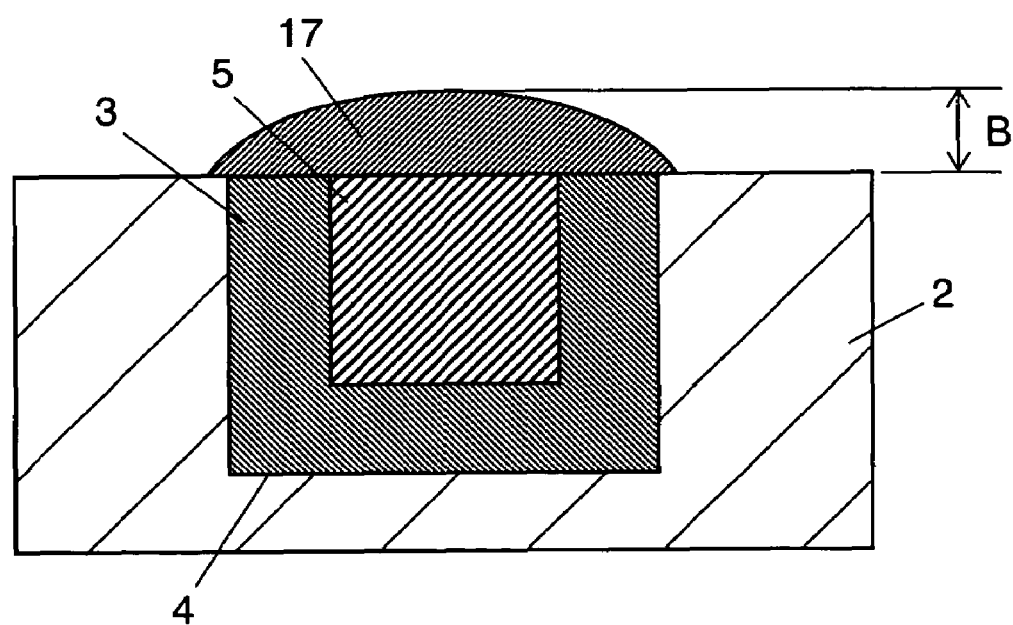
FIG. 5 is an enlarged cross-sectional view showing the construction of the coil electric conductor shown in FIG. 4.

In the case where conductive layer 17 is made of the metal including Ni as a major constituent, thickness B of conductive layer 17 is preferably not greater than 10 μm as shown in FIG. 5. In this case, it is possible to maintain the electric conductivity of coil electric conductor 16 at a high level while ensuring an anchor effect and a migration resistance effect.

The above description has referred to coil electric conductor 16 in which conductive layers 3, 5 and 17 are provided on only one of the faces of substrate 2, but coil electric conductor 16 may have a structure in which conductive layers 3, 5 and 17 are provided on the opposite face as well.

Figure 6A:
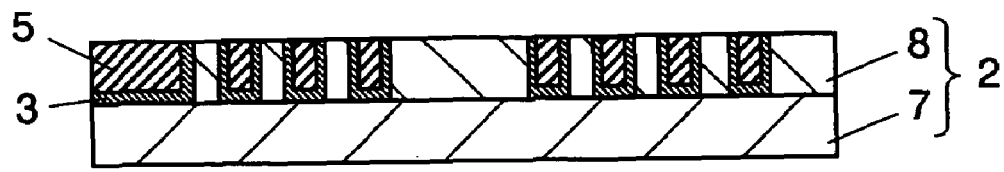
FIGS. 6A to 6C are cross-sectional views showing a production method for the coil electric conductor shown in FIG. 4.
Figure 6B:
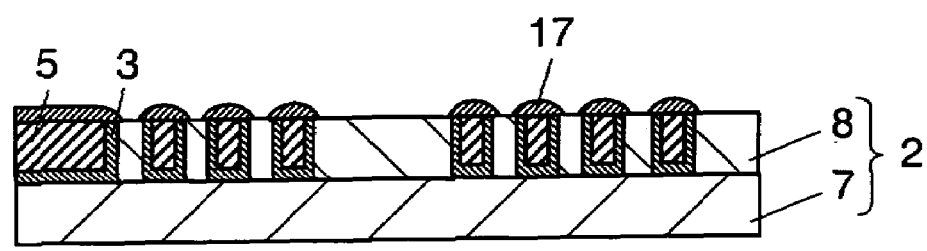
Figure 6C:
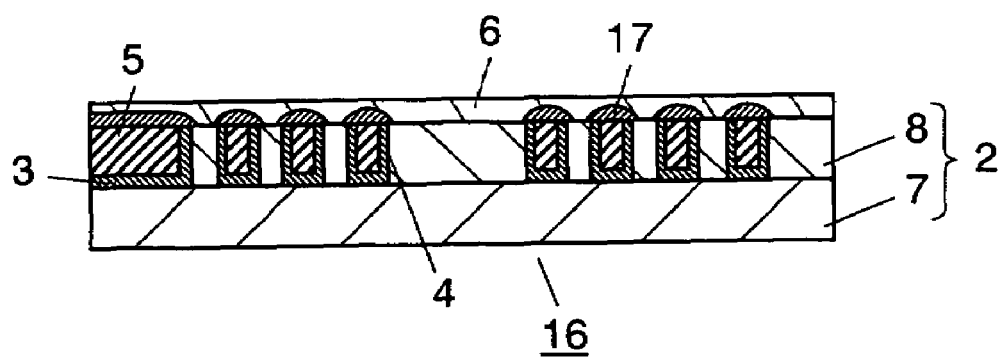

FIGS. 6A to 6C are cross-sectional views showing a production method for coil electric conductor 16. The production method for coil electric conductor 16 will be described below.

FIG. 6A shows an intermediate product (similar to that shown in FIG. 3H) of coil electric conductor 16 which is obtained through the producing method of Embodiment 1 described above with reference to FIGS. 3A to 3H.

As shown in FIG. 6B, conductive layer 17 grows and is formed on the externally exposed faces of conductive layers 3 and 5, by means of electroplating carried out by electricity supplied to conductive layers 3 and 5. This process is a first third-conductive-layer forming process. Then, as shown in FIG. 6C, in a protective-layer forming process, protective layer 6 is stuck onto the face of substrate 2.

The production method for coil electric conductor 16 shown in FIGS. 6A to 6C does not need the process of etching the section between each juxtaposed group of conductive layers 3, 5 and 17 after the formation of coil electric conductor 16. Accordingly, as compared with the related art process, the production method includes a small number of production processes and is suitable for mass production.

Incidentally, in the process shown in FIG. 6B, the conductive layer 17 formed by electroplating grows and is formed. Instead of electroplating, electroless plating may also be carried out to form conductive layer 17. Particularly in the case where conductive layer 17 is made of a metal including Ni as a major constituent, conductive layer 17 made of a Ni—B plating film or a Ni—P plating film is precipitated and formed on the externally exposed faces of conductive layers 3 and 5 merely by immersing substrate 2 on which conductive layers 3 and 5 are formed into a plating solution.

Embodiment 3

Figure 7:
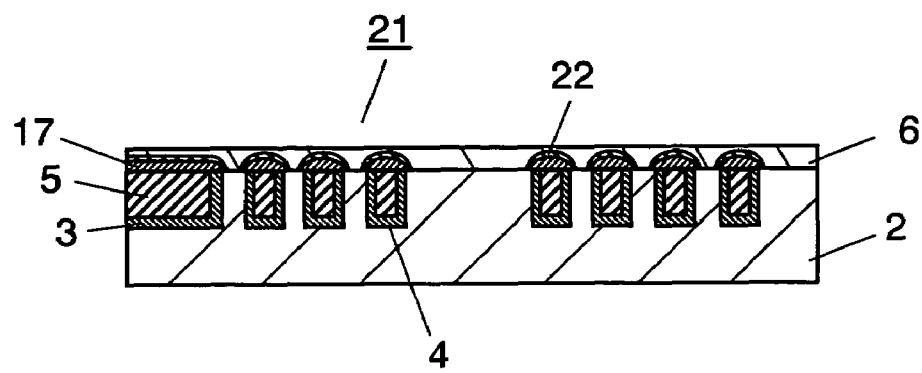
FIG. 7 is a cross-sectional view showing the construction of a coil electric conductor according to Embodiment 3 of the invention.

FIG. 7 is a cross-sectional view showing the construction of a coil electric conductor according to Embodiment 3. In FIG. 7, the same reference numerals are used to denote the same constituent elements as those of the construction of Embodiment 2 shown in FIG. 4, and detailed description is omitted herein.

Referring to FIG. 7, as compared with coil electric conductor 16, a coil electric conductor 21 has fourth conductive layer (hereinafter referred to as conductive layer) 22 between conductive layer 17 and protective layer 6.

Coil electric conductor 21 shown in FIG. 7 has the following advantages in addition to the advantages of coil electric conductor 16 mentioned above in the description of Embodiments 1 and 2.

Conductive layer 22 is disposed to coat the face of conductive layer 17 which is to be brought into contact with protective layer 6, whereby the space factor of coil electric conductor 21 is improved to a further extent.

In the case where conductive layer 22 is made of a metal including Cu or Ag as a major constituent, the electric conductivity of coil electric conductor 21 is improved to a further extent. In the case where conductive layer 22 is made of a metal including Cu as a major constituent, coil electric conductor 21 which has superior migration resistance and high electric conductivity is realized. In the case where conductive layer 22 is made of a metal including Ag as a major constituent, high adhesion can be ensured between conductive layer 22 and protective layer 6.

In addition, conductive layer 22 can obtain the following advantages by using a metal including Ni as a major constituent.

First, the adhesion between conductive layer 22 and protective layer 6 is improved by an anchor effect. Accordingly, it is possible to prevent peeling of conductive layer 22 from protective layer 6 due to impact.

In the case where a metal including Ni as a major constituent is used for conductive layer 3 as well, the conductive layers 5 and 17 are surrounded by the metal including Ni as a major constituent. Since the metal including Ni as a major constituent has superior migration resistance, coil electric conductor 21 can offer extremely high migration resistance performance. An electroless Ni—B plating film and an electroless Ni—P plating film are far more suitable for conductive layer 22 in terms of migration resistance. Accordingly, coil electric conductor 21 having a high space factor and high migration resistance is suitable for uses which require transmission of a large amount of current.

Advantages obtainable when the composition of each of conductive layers 3, 5 and 17 is specified are similar to those described in Embodiments 1 and 2, and the same description is omitted herein.

Figure 8:
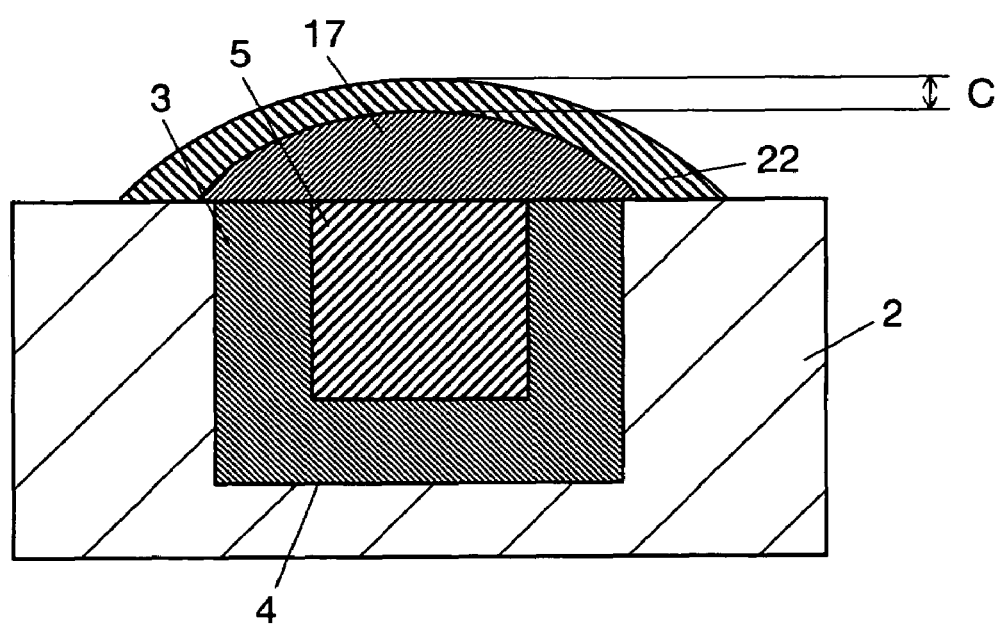
FIG. 8 is an enlarged cross-sectional view showing the construction of the coil electric conductor shown in FIG. 7.

In the case where the metal including Ni as a major constituent is used for the conductive layer 22, a thickness C of conductive layer 22 is preferably not greater than 10 μm as shown in FIG. 8.

The substrate 2 is not limited to a particular material and may use any kind of material having electric insulating properties, such as polyimide, glass epoxy or Phenol resin.

Coil electric conductor 21 in which conductive layers 3, 5, 17 and 22 are provided on only one of the faces of substrate 2 has been described above, but coil electric conductor 21 may have a structure in which conductive layers 3, 5, 17 and 22 are provided on the opposite face as well.

Figure 9A:
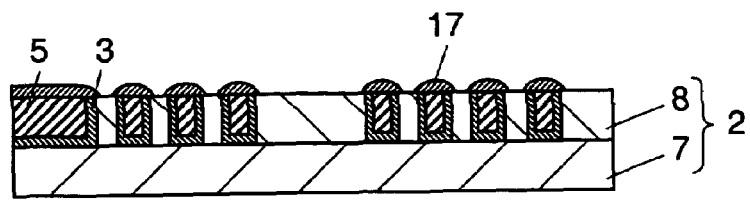
FIGS. 9A to 9C are cross-sectional views showing a production method for the coil electric conductor shown in FIG. 7.
Figure 9B:
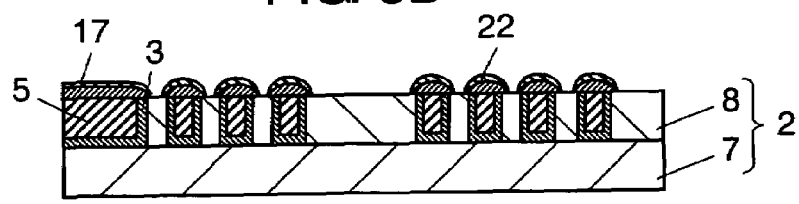
Figure 9C:
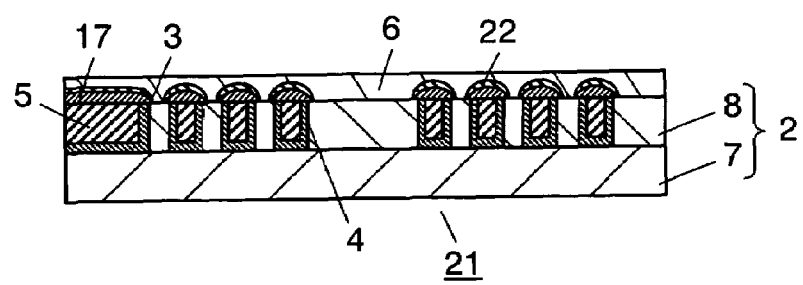

FIGS. 9A to 9C are cross-sectional views showing a production method for coil electric conductor 21. The production method for the coil electric conductor 21 will be described below.

FIG. 9A shows an intermediate product (similar to that shown in FIG. 6B) of coil electric conductor 21 which is obtained through the producing method of Embodiment 2 described above with reference to FIGS. 6A to 6C.

As shown in FIG. 9B, conductive layer 22 including Ni grows and is formed on the externally exposed face of conductive layer 17, by means of electroless plating. This process is a first fourth-conductive-layer forming process. Then, as shown in FIG. 9C, in a protective-layer forming process, protective layer 6 is stuck onto the face of substrate 2.

The production method for coil electric conductor 21 shown in FIGS. 9A to 9C does not need the process of etching the section between each juxtaposed group of conductive layers 3, 5, 17 and 22 after the formation of coil electric conductor 21. Accordingly, as compared with the related art process, the production method includes a small number of production processes and is suitable for mass production.

Incidentally, in the process shown in FIG. 9B, conductive layer 22 grows and is formed, by electroless plating. Conductive layer 22 may also be formed by electroplating carried out by electricity supplied to electric conductor 17, instead of by electroless plating.

Embodiment 4

Figure 10:
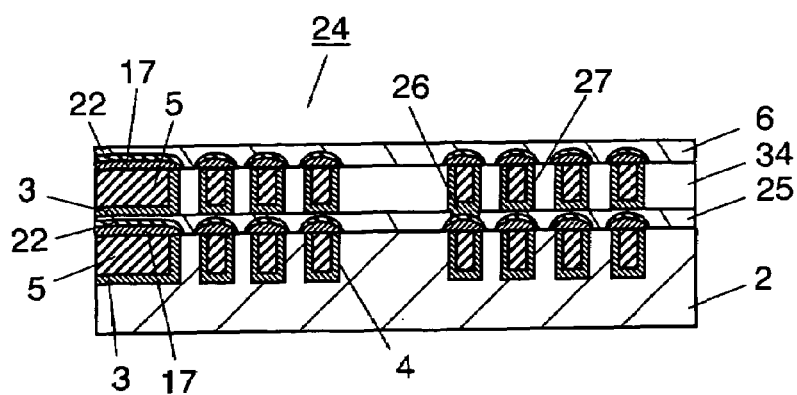
FIG. 10 is a cross-sectional view showing the construction of a laminated coil electric conductor according to Embodiment 4 of the invention.

FIG. 10 is a cross-sectional view showing the construction of a laminated coil electric conductor according to Embodiment 4. In FIG. 10, the same reference numerals are used to denote the same constituent elements as those of the construction of Embodiment 3 shown in FIG. 7, and detailed description is omitted herein.

Referring to FIG. 10, laminated coil electric conductor (hereinafter referred to as laminated conductor) 24 has a construction in which coil electric conductor 21 shown in FIG. 7 is laminated in two layers with adhesive layer 25 interposed therebetween.

Laminated conductor 24 shown in FIG. 10 has the following advantages in addition to the advantages of coil electric conductor 21 mentioned above in the description of Embodiments 1 to 3.

First, in laminated conductor 24, coil electric conductors 21 which are formed as laminated upper and lower layers are electrically connected to each other by through-hole 26. Accordingly, it is possible to realize laminated conductor 24 which has a compact size, a long overall length and a large number of turns.

Advantages obtainable when the composition of each of conductive layers 3, 5, 17 and 22 is specified have been described previously in Embodiments 1 to 3, and the same description is omitted herein.

Figure 11:
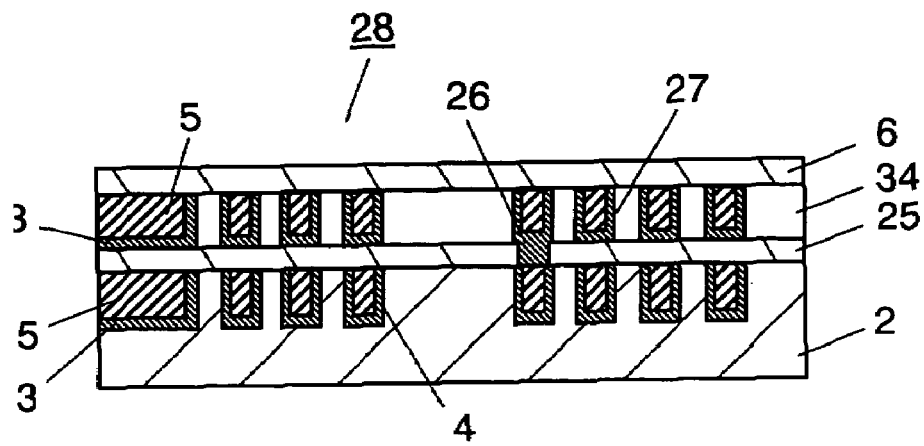
FIG. 11 is a cross-sectional view showing the construction of the laminated coil electric conductor according to Embodiment 4 of the invention.
Figure 12:
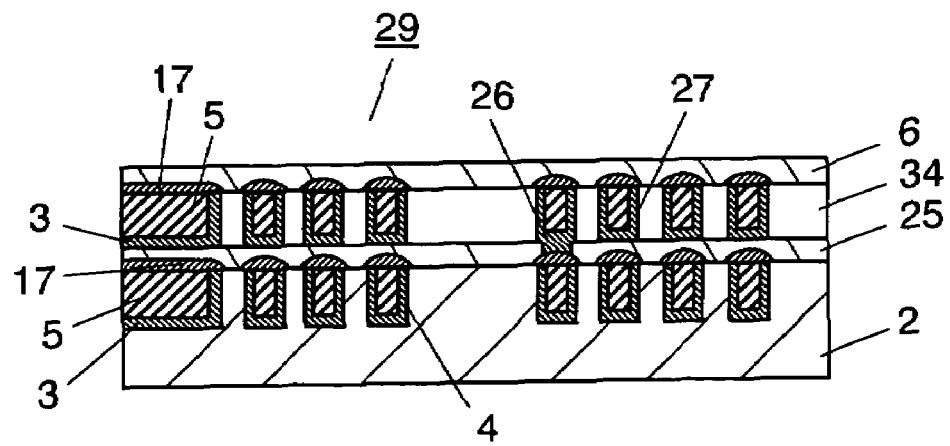
FIG. 12 is a cross-sectional view showing the construction of the laminated coil electric conductor according to Embodiment 4 of the invention.

Although laminated conductor 24 having conductive layers 17 and 22 has been mentioned above, conductive layers 17 and 22 may also be omitted. Namely, as shown in FIG. 11, the laminated coil electric conductor may have a structure like laminated coil electric conductor 28 having conductive layers 3 and 5. Otherwise, as shown in FIG. 12, laminated coil electric conductor may have a structure like laminated coil electric conductor 29 having conductive layers 3, 5 and 17.

Although laminated conductors 24, 28 and 29 each having a two-layer structure have been mentioned above by way of example, the coil electric conductor may also have a laminated structure made of three or more layers. In the case of three or more layers, the coil electric conductor has a far longer overall length and a far larger number of turns.

Substrate 2 is not limited to a particular material, and may use any kind of material having electric insulating properties, such as polyimide, glass epoxy or Phenol resin.

In the description of Embodiment 4, laminated conductor 24 in which the conductive layers 3, 5, 17 and 22 are provided on only one of the faces of substrate 2 has been mentioned above, but laminated conductor 24 may have a structure in which conductive layers 3, 5, 17 and 22 are provided on the opposite face as well.

FIGS. 13A to 13F are cross-sectional views showing a production method for laminated conductor 24 according to Embodiment 4. The production method for laminated conductor 24 will be described below.

Figure 13A:
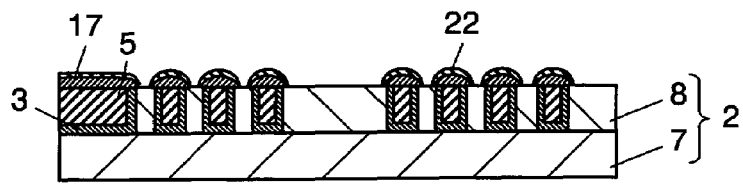
FIGS. 13A to 13F are cross-sectional views showing a production method for the laminated coil electric conductor shown in FIG. 10.

FIG. 13A shows an intermediate product (similar to that shown in FIG. 9B) of laminated conductor 24 which is obtained through the producing method of Embodiment 3 described above with reference to FIGS. 9A to 9C.

Figure 13B:
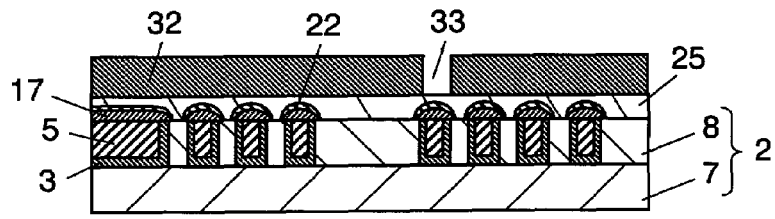
Figure 13C:
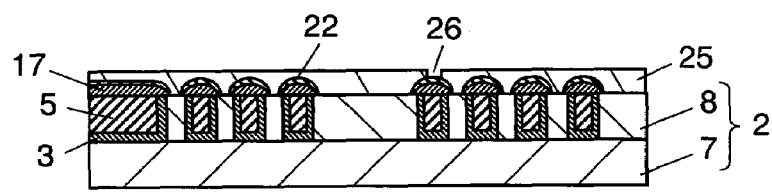

As shown in FIG. 13B, in an adhesive-layer forming process, adhesive layer 25 having electric insulating properties is stuck onto substrate 2. In addition, a photo resist material is uniformly coated or stuck onto a face of adhesive layer 25, thereby forming photo resist layer 32. Then, a part of photo resist layer 32 in a section corresponding to conductive layer 22 is exposed and developed, whereby hole section 33 is formed. Then, as shown in FIG. 13C, adhesive layer 25 which faces hole section 33 is etched, whereby through-hole 26 which extends to conductive layer 22 is formed in adhesive layer 25. After that, photo resist layer 32 is removed. The above-described process is a through-hole forming process.

Figure 13D:
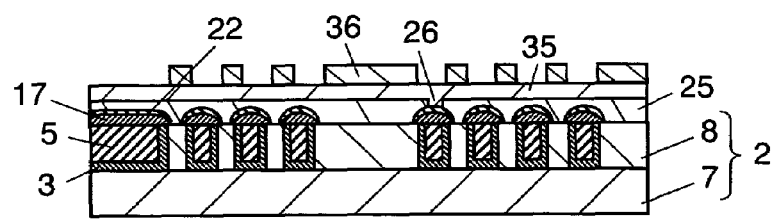

Then, as shown in FIG. 13D, in a second substrate forming process, another insulating substrate (hereinafter referred to as substrate) 35 is stuck onto adhesive layer 25. A photo resist is uniformly coated or stuck onto a face of substrate 35, thereby forming photo resist layer 36. Photo resist layer 36 is exposed to illumination from a mercury lamp via a mask, whereby a section corresponding to through-hole 26 of adhesive layer 25 and a desired conductive layer pattern are formed by development.

Figure 13E:
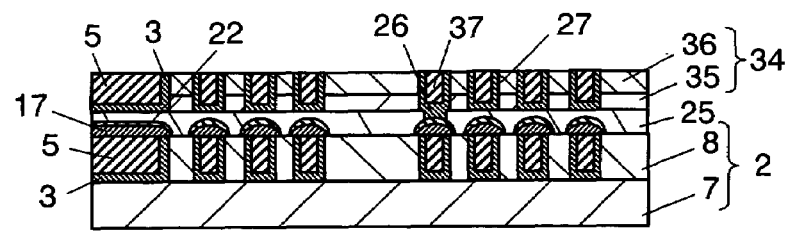

Then, as shown in FIG. 13E, substrate 35 is etched, whereby hole section 37 extending to adhesive layer 25 and second depression (hereinafter referred to as depression) 27 are formed in substrate 35. Remaining substrate 35 and photo resist layer 36 form second insulating substrate (hereinafter referred to as substrate) 34. This process is a second depression forming process. Then, in a second first-conductive-layer forming process, electroless plating forms conductive layer 13 on the face of substrate 34 which includes hole section 37 and depression 27. Furthermore, in a second second-conductive-layer forming process, conductive layer 14 is formed on conductive layer 13 by electroplating. Conductive layer 14 is formed with conductive layer 13 interposed between conductive layer 14 and substrate 2. After that, in a second removing process, conductive layers 13 and 14 are polished and removed until a face of photo resist layer 36 is exposed. Thus, conductive layers 3 and 5 are formed.

Figure 13F:
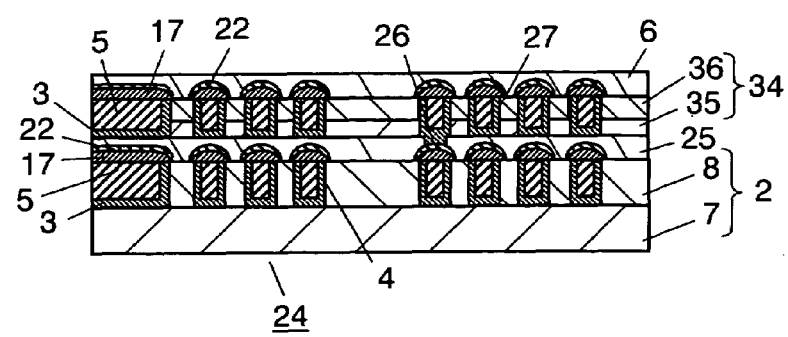

Then, as shown in FIG. 13F, in a second third-conductive-layer forming process, conductive layer 17 grows and is formed on the externally exposed faces of conductive layers 3 and 5, by means of electroplating carried out by electricity supplied to conductive layers 3 and 5. Furthermore, in a second fourth-conductive-layer forming process, conductive layer 22 grows and is formed on the externally exposed face of conductive layer 17, by means of electroless plating. After that, in a protective-layer forming process, protective layer 6 is stuck onto the face of substrate 34.

In the production method for laminated conductor 24 shown in FIGS. 13A to 13F, the section between each juxtaposed pair of conductive layers 3, 5, 17 and 22 is not etched after the formation of laminated conductor 24. Accordingly, as compared with the related art process, the production method includes a small number of production processes and is suitable for mass production.

In the processes shown in FIG. 13B and FIG. 13C, through-hole 26 is formed in adhesive layer 25 by the exposure, development and etching of photo resist layer 32. Through-hole 26 may also be formed by illumination of adhesive layer 25 by laser light, instead of by exposure, development and etching.

In the process shown in FIG. 13E, conductive layer 13 is formed by electroless plating. Palladium (Pd) is generally used as a catalyst, but it is possible to use other kinds of catalysts such as metal nano-particles of gold, silver, titanium and the like. Conductive layer 13 may also be formed by evaporation or sputtering instead of electroless plating.

Furthermore, although conductive layers 3 and 5 are removed by polishing in the process of FIG. 13E, it is possible to use any other method, such as grinding or cutting except polishing, which can remove part of conductive layers 13 and 14 until conductive layers 13 and 14 become flush with the face of substrate 36.

Although the production method for laminated conductor 24 having conductive layers 17 and 22 has been mentioned above, the process of producing conductive layers 17 and 22 or conductive layer 22 may be omitted in the case of production of laminated conductor 28 or 29.

In addition, although the production method for laminated conductor 24 having a two-layer structure has been mentioned above by way of example, it is also possible to produce a laminated coil electric conductor having a laminated structure made of three or more layers. In a production method for a laminated coil electric conductor having three or more layers, after the completion of the process shown in FIG. 13E, the process of FIG. 13B is again started and the processes shown in FIGS. 13B to 13E are repeated. Namely, after the second removing process, the adhesive-layer forming process, the through-hole forming process, the second substrate forming process, the second depression forming process, the second first-conductive-layer forming process, the second second-conductive-layer forming process, the second removing process, the second third-conductive-layer forming process and the second fourth-conductive-layer forming process are repeated.

As the production method for laminated conductor 24, the process of sequentially laminating substrates 2 and 34 and conductive layers 3, 5, 17 and 22 has been described above. However, the production method for laminated conductor 24 is not limited to this process. For example, after the process of FIG. 13C, coil electric conductor 21 provided with through-hole 26 may be adhered to substrate 2 by means of adhesive layer 25, to produce laminated conductor 24. Furthermore, a plurality of intermediate products of coil electric conductor 21 which are obtained before the formation of protective layer 6 may be adhered in layers by means of adhesive layers 25, so that a coil electric conductor having three or more layers can be obtained.

In addition, in the case where each of depressions 4 and 34 is formed in a shape such as a circular spiral, a rectangular spiral or a polygonal line, the coil electric conductor 1 functions as an electronic component such as an inductance device. However, depressions 4 and 34 is necessarily limited to any of the above-mentioned shapes.

Embodiment 5

Figure 14:
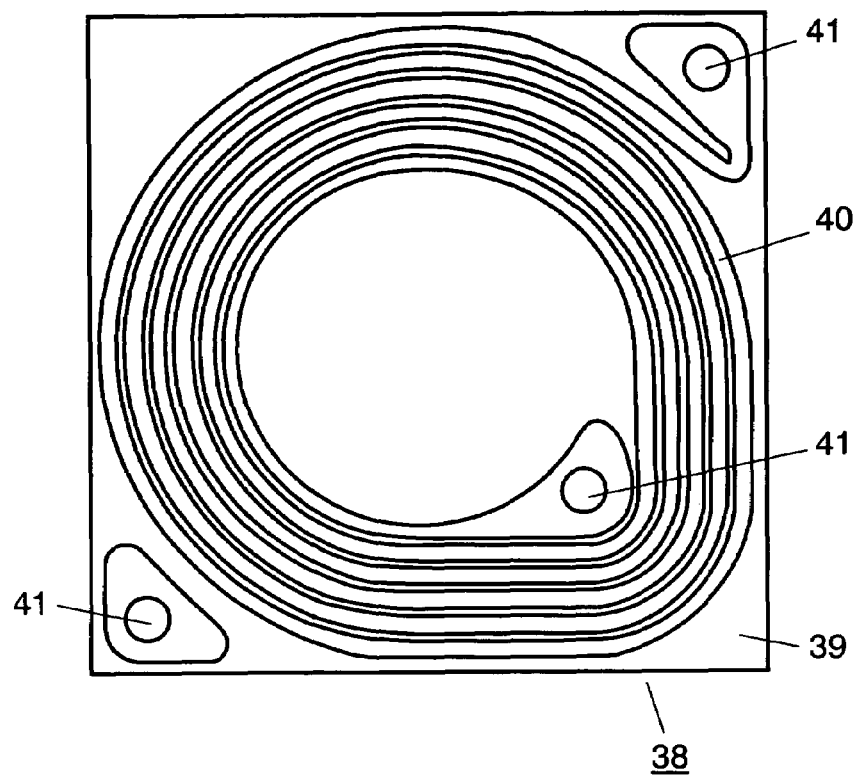
FIG. 14 is a plan view showing an electronic component according to Embodiment 5 of the invention.

FIG. 14 is a plan view showing the construction of an electronic component according to Embodiment 5.

As shown in FIG. 14, planar coil 38 which is an electronic component such as an inductance device has coil electric conductor (hereinafter referred to as conductor) 40 and through-holes 41 on insulating substrate 39. The cross section of planar coil 38 can take the form of any of coil electric conductor 1, 16 and 21 or the form of any of laminated coil electric conductors 24, 28 and 29.

The conductor 40 is formed of circular spiral conductive layers 3 and 5. Through-holes 41 operate as connection terminals through which to supply electric signals to conductor 40.

The shape of conductor 40 is not limited to a circular spiral, and may be any arbitrary shape that enables conductor 40 to function as an electronic component, for example, a rectangular spiral and a polygonal line which have been used in conventional electronic components. Double thin ferromagnetic cores such as a NiZn-based ferrite material may clamp planar coil 38 interposed therebetween.

In addition, if a plurality of planar coils 38 may be laminated in layers with a thin ferromagnetic core interposed therebetween, a planar transformer can be obtained.

Planar coil 38 has a structure in which conductive layer 3 is provided in depression 4 provided on one of the faces of insulating substrate 39 and conductive layer 5 is formed on conductive layer 3 so that conductor 40 is formed. Accordingly, planar coil 38 has a highly precise cross-sectional shape and can be prevented from suffering breakdowns due to external impact during mounting or during use of an electronic apparatus. Furthermore, it is possible to realize an electronic apparatus using planar coil 38 which can be prevented from suffering trouble due to migration phenomena while the electronic apparatus is used for a long time.

In addition, conductors 40 may also be provided on the opposite sides of insulating substrate 39 as well.

Planar coil 38 and the planar transformer can offer the advantages mentioned above in the description of Embodiments 1 to 4.

Embodiment 6

Figure 15:
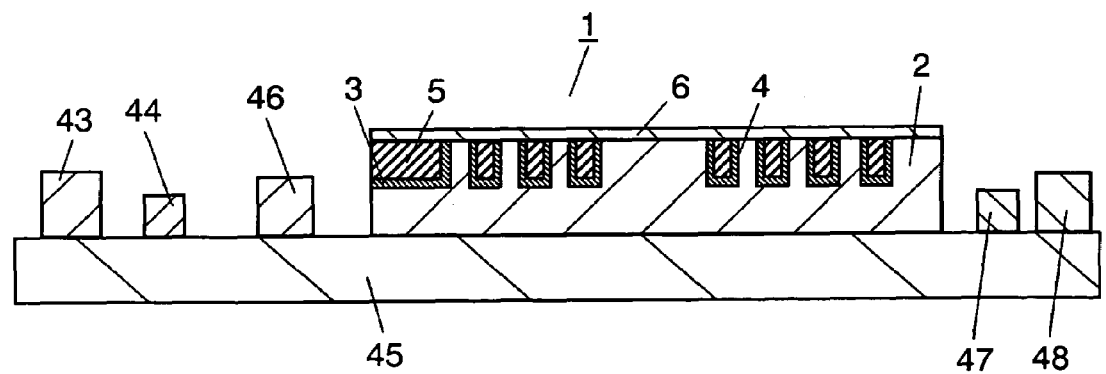
FIG. 15 is a schematic cross-sectional view of an electronic apparatus using an electronic component according to Embodiment 6 of the invention.
Figure 16A:
FIGS. 16A to 16E are cross-sectional views showing a production method for a coil electric conductor according to a related art example.
Figure 16B:
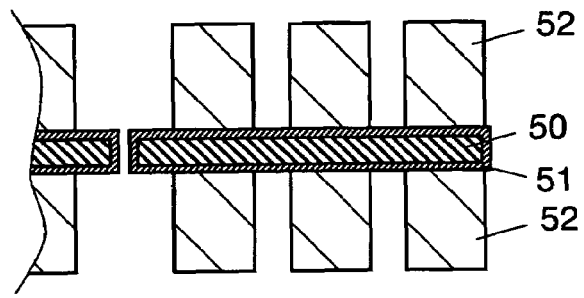
Figure 16C:
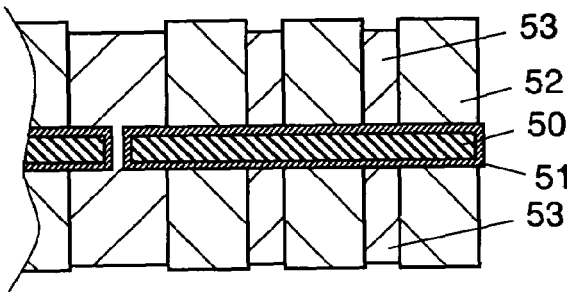
Figure 16D:
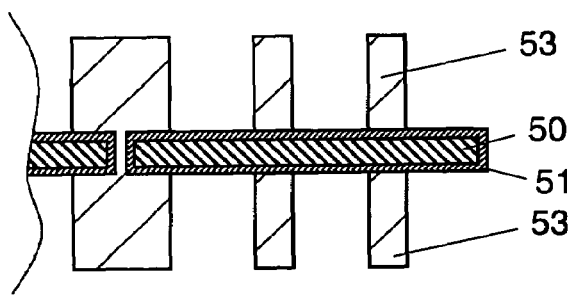
Figure 16E:
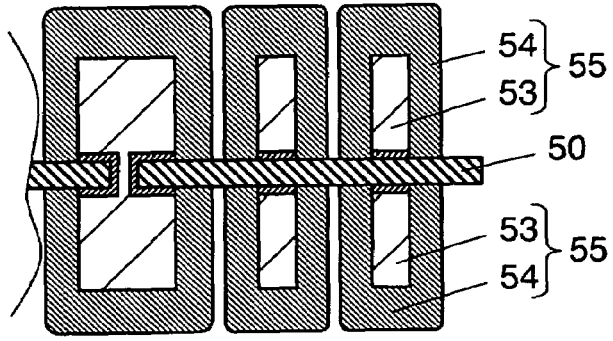
Figure 17A:
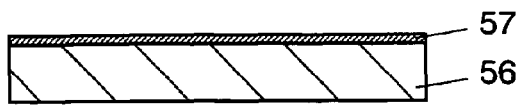
FIGS. 17A to 17G are cross-sectional views showing a production method for a coil electric conductor according to a related art example.
Figure 17B:
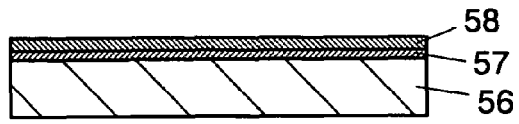
Figure 17C:
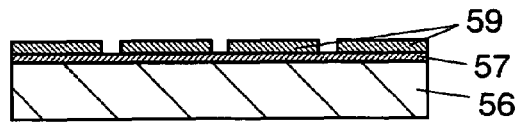
Figure 17D:
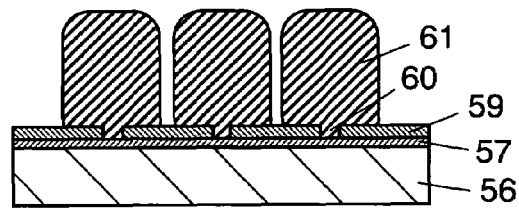
Figure 17E:
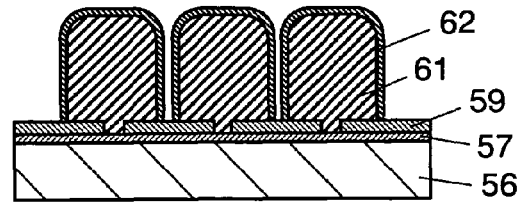
Figure 17F:
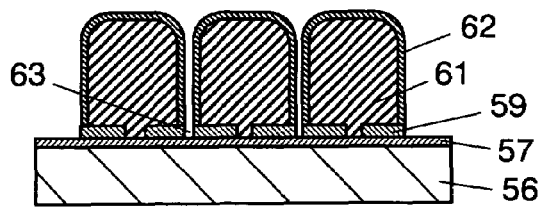
Figure 17G:
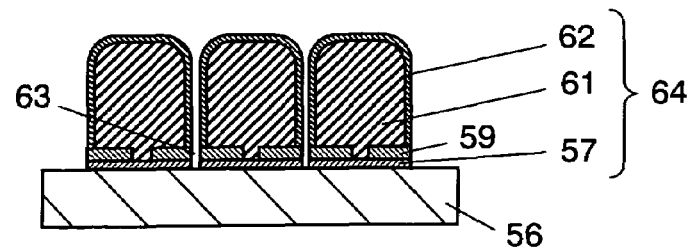

FIG. 15 is a schematic cross-sectional view showing a circuit structure section in which coil electric conductor 1 mentioned above in the description of Embodiment 1 of the invention is mounted in an electronic apparatus as an electronic component such as an inductance device. The electronic apparatus is, for example, a notebook mobile computer, a consumer game machine, a portable information terminal or an AV device.

Referring to FIG. 15, coil electric conductor 1, semiconductor chip 43 and capacitor 44 are mounted on motherboard 45. In addition, inductance component 46, capacitor component 47 and resistance component 48 are similarly mounted on motherboard 45.

Coil electric conductor 1 has a structure in which conductive layer 3 is provided at depression 4 provided on one of the faces of substrate 2 and conductive layer 5 is formed on conductive layer 3. Coil electric conductor 1 functions as a choke coil which is an inductance device. Accordingly, coil electric conductor 1 has a highly precise cross-sectional shape and can be prevented from suffering breakdowns due to external impact during mounting or during use of the electronic apparatus. Furthermore, it is possible to realize an electronic apparatus using coil electric conductor 1 which can be prevented from suffering trouble due to migration phenomena while the electronic apparatus is used for a long time.

Although FIG. 15 shows a construction in which coil electric conductor 1 is mounted, coil electric conductor 16 or 21 or laminated coil electric conductor 24, 28 or 29 may also be mounted. Coil electric conductors 1, 16 or 21 or laminated conductors 24, 28 or 29 which are constructed to clamp a ferromagnetic core interposed therebetween function as a transformer.

What is claimed is:

1. A coil electric conductor comprising:
   an insulating substrate having a depression in its face;
   a first conductive layer formed in said depression;
   a second conductive layer formed on the first conductive layer, said first conductive layer being interposed between said second conductive layer and said insulating substrate; and
   a third conductive layer coating said first conductive layer and said second conductive layer;
   wherein said depression is filled with said first conductive layer and said second conductive layer; and
   wherein an entirety of said third conductive layer is provided outside of said depression.

2. A coil electric conductor according to claim 1, wherein said first conductive layer has a thickness of not greater than 10 μm.

3. A coil electric conductor according to claim 1, wherein said third conductive layer has a thickness of not greater than 10 μm.

4. A coil electric conductor according to claim 1, further comprising:
   a fourth conductive layer coating said third conductive layer.

5. A coil electric conductor according to claim 4, wherein said fourth conductive layer has a thickness of not greater than 10 μm.

6. A coil electric conductor according to claim 4, wherein:
   each of said second conductive layer and said third conductive layer is made of a metal including Ag as a major constituent; and
   each of said first conductive layer and said fourth conductive layer is made of a metal including Cu as a major constituent.

7. A coil electric conductor according to claim 4, wherein:
   each of said second conductive layer and said third conductive layer is made of a metal including Ag as a major constituent; and
   each of said first conductive layer and said fourth conductive layer is made of a metal including Ni as a major constituent.

8. A coil electric conductor according to claim 4, wherein:
   each of said second conductive layer and said third conductive layer is made of a metal including Cu as a major constituent; and
   each of said first conductive layer and said fourth conductive layer is made of a metal including Ni as a major constituent.

9. A laminated coil electric conductor comprising:
   a plurality of coil electric conductors laminated in layers, each of said coil electric conductors including
      an insulating substrate having a depression in its face,
      a first conductive layer formed in said depression,
      a second conductive layer formed on said first conductive layer, said first conductive layer being interposed between said second conductive layer and said insulating substrate, and
      a third conductive layer coating said first conductive layer and said second conductive layer,
      wherein said depression is filled with said first conductive layer and said second conductive layer, and
      wherein an entirety of said third conductive layer is provided outside of said depression,
   wherein the insulating substrate of an upper one of said coil electric conductors laminated in layers is provided with a through-hole through which said coil electric conductors laminated in layers are electrically connected to one another.

10. A laminated coil electric conductor according to claim 9, wherein
    said first conductive layer has a thickness of not greater than 10 82 m.

11. A laminated coil electric conductor comprising:
    a plurality of coil electric conductors laminated in layers, each of said coil electric conductors including
       an insulating substrate having a depression in its face,
       a first conductive layer formed in said depression;
       a second conductive layer formed on said first conductive layer, said first conductive layer being interposed between said second conductive layer and said insulating substrate,
       a third conductive layer coating said first conductive layer and said second conductive layer, and
       a fourth conductive layer coating said third conductive layer,
       wherein said depression is filled with said first conductive layer and said second conductive layer, and
       wherein an entirety of said third conductive layer is provided outside of said depression;
    wherein the insulating substrate of an upper one of said coil electric conductors laminated in layers is provided with a through-hole through which said coil electric conductors laminated in layers are electrically connected to one another.

12. A laminated coil electric conductor according to claim 11, wherein:
    each of said second conductive layer and said third conductive layer is made of a metal including Ag as a major constituent; and
    each of said first conductive layer and said fourth conductive layer is made of a metal including Cu as a major constituent.

13. A laminated coil electric conductor according to claim 11, wherein:
    each of said second conductive layer and said third conductive layer is made of a metal including Ag as a major constituent; and
    each of said first conductive layer and said fourth conductive layer is made of a metal including Ni as a major constituent.

14. A laminated coil electric conductor according to claim 11, wherein:
    each of said second conductive layer and said third conductive layer is made of a metal including Cu as a major constituent; and
    each of said first conductive layer and said fourth conductive layer is made of a metal including Ni as a major constituent.

15. A laminated coil electric conductor according to claim 11, wherein
    each of said first conductive layer, said third conductive layer and said fourth conductive layer has a thickness of not greater than 10 μm.

16. An electronic component including a coil electric conductor comprising:
  an insulating substrate having a depression in its face;
  a first conductive layer formed in said depression;
  a second conductive layer formed on said first conductive layer, said first conductive layer being interposed between said second conductive layer and said insulating substrate; and
  a third conductive layer coating said first conductive layer and said second conductive layer;
  wherein said depression is filled with said first conductive layer and said second conductive layer; and
  wherein an entirety of said third conductive layer is provided outside of said depression.

17. An electronic component according to claim 16, further comprising
  a terminal connected to said first conductive layer, said second conductive layer, and said third conductive layer;
  wherein said depression is a spiral depression.

* * * * *

UNITED STATES PATENT AND TRADEMARK OFFICE
CERTIFICATE OF CORRECTION

PATENT NO.         : 7,394,341 B2                                   Page 1 of 1
APPLICATION NO.    : 11/017884
DATED              : July 1, 2008
INVENTOR(S)        : Koji Shimoyama et al.

It is certified that error appears in the above-identified patent and that said Letters Patent is hereby corrected as shown below:

IN THE CLAIMS

In column 14, line 15 (claim 10, line 4), please change "than 10 82 m." to --than 10 µm.--

Signed and Sealed this

Twenty-eighth Day of October, 2008

JON W. DUDAS
*Director of the United States Patent and Trademark Office*